United States Patent
Roberts et al.

(10) Patent No.: US 7,767,383 B2
(45) Date of Patent: *Aug. 3, 2010

(54) METHOD OF PRE-EXPOSING RELIEF IMAGE PRINTING PLATE

(76) Inventors: David H. Roberts, 3018 Pueblo St., Carlsbad, CA (US) 92009; Gary T. Markhart, 2904 Corte Celeste, Carlsbad, CA (US) 92009

( * ) Notice: Subject to any disclaimer, the term of this patent is extended or adjusted under 35 U.S.C. 154(b) by 0 days.

This patent is subject to a terminal disclaimer.

(21) Appl. No.: 11/890,827

(22) Filed: Aug. 8, 2007

(65) Prior Publication Data

US 2009/0042138 A1 Feb. 12, 2009

(51) Int. Cl.
G03F 7/26 (2006.01)

(52) U.S. Cl. .................. 430/302; 430/300

(58) Field of Classification Search ......... 430/270.1, 430/281.1, 300, 302
See application file for complete search history.

(56) References Cited

U.S. PATENT DOCUMENTS

| | | | |
|---|---|---|---|
| 4,046,071 A | 9/1977 | Mizuno et al. | |
| 4,187,107 A * | 2/1980 | Homma et al. | 430/252 |
| 4,540,649 A | 9/1985 | Sakurai | |
| 4,945,020 A * | 7/1990 | Kempf et al. | 430/49.1 |
| 5,099,276 A * | 3/1992 | Kagosaki | 355/70 |
| 5,330,882 A | 7/1994 | Kawaguchi et al. | |
| 5,455,416 A | 10/1995 | Zertani et al. | |
| 5,645,974 A | 7/1997 | Ohta et al. | |
| 5,858,589 A * | 1/1999 | Govaert et al. | 430/30 |
| 5,925,500 A | 7/1999 | Yang et al. | |
| 6,238,837 B1 | 5/2001 | Fan | |
| 6,903,809 B2 | 6/2005 | Donahue et al. | |
| 6,989,220 B2 * | 1/2006 | Kanga | 430/14 |
| 7,125,650 B2 | 10/2006 | Roberts et al. | |
| 7,126,724 B2 | 10/2006 | McCrea et al. | |
| 7,632,625 B2 | 12/2009 | Roberts et al. | |
| 2004/0095592 A1 * | 5/2004 | Sanger | 358/1.9 |
| 2006/0019193 A1 * | 1/2006 | Roberts et al. | 430/270.1 |
| 2007/0046920 A1 * | 3/2007 | Laan et al. | 355/69 |

FOREIGN PATENT DOCUMENTS

WO 2005/119366 12/2005

OTHER PUBLICATIONS

The DTP/HTML Tutorials, Ron F. Woolley, "Halftone Screens," 1997-2003, www.dtp-aus.com/hlftone.htm.

* cited by examiner

*Primary Examiner*—Cynthia H Kelly
*Assistant Examiner*—Chanceity N Robinson
(74) *Attorney, Agent, or Firm*—Carmody & Torrance LLP

(57) ABSTRACT

The present invention is directed to a method of selectively pre-exposing a photosensitive printing element prior to imagewise exposure in order to remove oxygen from the photosensitive layer prior to imagewise exposure. The invention is usable in a computer-to-plate process to produce flexographic relief image printing elements.

11 Claims, 1 Drawing Sheet

Highlight Dots

Midtone Dots

Shadow Dots

METHOD OF PRE-EXPOSING RELIEF IMAGE PRINTING PLATE

FIELD OF THE INVENTION

The present invention is directed to methods for selectively pre-exposing photosensitive printing elements prior to imagewise exposure.

BACKGROUND OF THE INVENTION

Flexographic printing is a method of direct rotary printing that uses a resilient relief image in a plate of rubber or photopolymer to print articles such as cartons, bags, labels or books. Flexographic printing is widely used in the production of newspapers and in the decorative printing of packaging media. Photosensitive printing plates and cylindrical printing sleeves have been developed to meet the demand for fast, inexpensive processing and long press runs.

While the quality of articles printed using flexographic plates has improved significantly as the technology has matured, physical limitations related to the process of creating a relief image in a plate remain. In particular, it is very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas.

Maintaining small dots on flexographic plates can be very difficult due to the nature of the platemaking process. Some digital flexographic printing elements use an integral UV-opaque mask layer coated over the photopolymer as described for example in U.S. Pat. No. 5,925,500 to Yang et al. and U.S. Pat. No. 6,238,837 to Fan, the subject matter of each of which is herein incorporated by reference in its entirety. In a pre-imaging (or post-imaging) step the floor of the plate is set by back exposure to UV light which hardens the photopolymer to the relief depth required for optimal printing. This step is followed by selective ablation of the mask layer with a laser (e.g., infrared laser) to form an image mask that is opaque to ultraviolet (UV) light in non-ablated areas. Next, the print element is exposed to image-forming UV radiation and developed to remove areas not exposed to UV radiation and reveal the relief image, for example using solvents or heat plus blotting. The combination of the mask and UV exposure produces relief dots that have a generally conical shape. The smallest of these dots are prone to being removed during processing, which means no ink is transferred to these areas during printing (the dot is not "held" on plate and/or on press). Alternatively, if the dot survives processing they are susceptible to damage on press. For example small dots often fold over and/or partially break off during printing causing either excess ink or no ink to be transferred.

Solid photocurable elements used to make flexographic relief image printing plates typically comprise a support layer, one or more photocurable layers, and often a protective cover sheet. The protective cover sheet is formed from plastic or any other removable material that can protect the plate or photocurable element from damage until it is ready to be imaged. The photocurable element may also optionally comprise a slip film disposed between the protective cover sheet and the photocurable layer(s) to protect the plate from contamination, increase ease of handling, and act as an ink-accepting layer.

The use of a photosensitive printing medium for the manufacture of flexographic printing elements, including plates and sleeves, is described in general terms as follows. The photosensitive printing material is deposited onto the support layer to form a printing element, and may be deposited onto the support layer in a variety of ways, e.g., by extrusion, roll coating, heat processing, solvent casting, and the like. These techniques can be readily carried out by those skilled in the art.

The support layer can be formed from a transparent or opaque material such as paper, cellulose film, plastic, or metal. Preferred substrate materials include steel, copper, or aluminum sheets, plates, or foils; paper; or films or sheets made from synthetic polymeric materials such as polyesters, polystyrene, polyolefins, polyamides, and the like. The support sheet can optionally comprise a bonding layer for more secure attachment to the photocurable layer(s) and control of the substrate's reflectivity.

The photosensitive layer(s) can include a variety of known photosensitive materials, such as polymers, initiators, reactive diluents, fillers, and dyes. Preferred photosensitive compositions include an elastomer compound, an ethylenically unsaturated compound having at least one terminal ethylenic group, and a photoinitiator. Such materials are described in numerous patents and publications and are well known to those skilled in the art.

The photosensitive materials of the invention should cross-link (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and near-UV wavelength regions. Preferred actinic wavelength regions are from about 320 nm to about 450 nm, more preferably from about 350 nm to about 415 nm.

The desired image is produced on the printing plate by exposing selected portions of the resin to actinic radiation. Selective exposure of the photosensitive resin has traditionally been achieved for example, by the use of an image-bearing mask such as a negative film on the surface of the photosensitive layer, through the front side of the photosensitive resin. Areas of the mask opaque to actinic radiation prevent the initiation of free-radical polymerization within the photosensitive layer directly beneath the mask. Transparent areas of the image-bearing mask will allow the penetration of actinic radiation into the photosensitive layer, initiating free-radical polymerization, rendering those areas insoluble in the processing solvent. Alternatively, exposure of selected portions of the photosensitive layer to laser radiation or other digitally controlled actinic light source (i.e., digital platemaking) may also initiate free-radical polymerization, rendering those areas insoluble in the processing solvent.

In the case of digital direct-write plate making or "computer to plate" (CTP) processes, digital files incorporate a variety of text and graphical elements. Digital platesetting interprets and images digital data onto a printing plate that is used as the medium to transfer ink to paper on a printing press. Printing presses include any of a variety of plate printing processes, such as offset, flexo and gravure. In the CTP process, the digitally controlled actinic light is selectively scanned across the dimensions of the plate as guided by an image stored in an electronic data file. The image area of the plate is directly cured by the actinic light, leaving the non-image area uncured and able to be removed in the plate processing step.

Typically, a workstation receives image data. For example, the workstation may be a general purpose programmable computer such as a PC running a MICROSOFT WINDOWS® or Linux operating system. The image data is converted into a raster image by a Raster Image Processor (RIP). "RIPing" is the process of configuring the image file in a way that the device can print it. For example, if the device supports a certain dots per inch (DPI) resolution, the file is "ripped" to that resolution. The RIP may employ a plug-in implanting rasterizing functions in hardware, a stand-alone hardware device, and/or a software module that runs on a suitable computer. The RIP converts the image data into halftone data, and the halftone data is passed onto an image processor. The image processor may be implemented in hardware, software or both. The image processor scans the halftone data and the resulting halftone data is sent to an output device that prepares the flexographic printing plate in accordance with the halftone data. The image processor may process the halftone data on the fly or, more preferably, the workstation may incorporate or allocate memory for storing halftone data prior to outputting it to the imaging device.

Thereafter, a development step is employed to selectively remove the unexposed and therefore unhardened portions of the resin. Development may include, by way of example and not limitation, washing in a suitable solvent or thermal blotting, as is well known in the art. The resulting surface has a relief pattern that reproduces the image to be printed. The printing element is then mounted on a press and printing commences.

Printing plates such as flexographic plates coated with a photopolymer resin layer are typically digitally imaged or patterned using a modulated and rasterized laser beam or beams, or an array of light produced by an illuminated and re-imaged spatial light modulator array, in a machine such as a computer-to-plate (CTP) exposure system. Flexo plates are typically not manufactured in an oxygen-free environment and are not coated or packaged in any way to rigorously exclude molecular oxygen. As such, oxygen is distributed throughout the photopolymer. Oxygen is well known to those skilled in the art to be a strong inhibitor of the radical cure chemistry that is most commonly used in flexo printing plates. If oxygen is removed from such a flexo plate, ambient oxygen will diffuse back into the resin over time if the plate is in contact with atmospheric air.

The third dimension of the exposed and developed flexo plate, especially the sidewall slope of a patterned feature, is a critical determinant of exposed image quality. For an isolated dot on such a plate, a wide base and a narrow flat top are preferred. This is achieved with conventionally exposed ultraviolet sensitive photopolymer resins by first "bumping" the plate, i.e., uniformly flooding the entire plate with ultraviolet light to photometrically consume the dissolved oxygen throughout the resin, followed by exposing with patterned light to polymerize selected features on the plate. The exposed plate is then developed, leaving a residual image of polymerized resin attached to the plate substrate. The bumping process initiates a chemical reaction in the unexposed plate with a time constant that in thick flexographic resins has been measured in several seconds. Immediately after the bump is applied, ambient oxygen begins to diffuse back into the plate from the surface. This leads to a higher oxygen concentration in the resin closer to the surface (top of plate) than to the substrate (bottom of plate) so that photopolymerization inhibition is greater just near the surface. Thus, when the patterning exposure is performed, the dot base is more polymerized than the top resulting in a wider base and a narrower top.

For a successful flexo CTP system, it is necessary to tailor the oxygen concentration throughout the resin cross section with a pre-exposure system that adjusts the bump irradiance and the elapsed time from the bump until the patterning exposure.

Photosensitive resin compositions generally cure through radical polymerization, upon exposure to light. The curing reaction is inhibited by oxygen, which is dissolved in the resin compositions, because oxygen functions as a radical scavenger. It is therefore highly preferred that the dissolved oxygen be removed from the photosensitive resin composition prior to exposure. Various techniques have been suggested for removing dissolved oxygen from the photosensitive resin composition. For example, the photosensitive resin composition may be placed in an atmosphere of inert gas (e.g., carbon dioxide or nitrogen) overnight before exposure in order to replace the dissolved oxygen with the inert gas by way of diffusion. The drawback to this method is that it can take a long time and requires a large space for the necessary machinery.

Alternatively, the photosensitive resin printing element may be given a weak blanket "pre-exposure" to consume the dissolved oxygen prior to subjecting the printing element to the main image-wise exposure. This pre-exposure step is also called a "bump" exposure. The bump exposure is applied to the entire plate area and is a short, low dose exposure of the plate that ostensibly reduces oxygen, which inhibits photopolymerization of the plate (or other printing element). Without this pre-sensitization step, fine features (i.e., highlight dots, fine lines, isolated dots, etc.) are not preserved on the finished plate without unusually long and inconvenient exposure times. However, the pre-sensitization step, if done to excess, can tend to cause shadow tones to fill-in, causing the printed gamut to be significantly reduced. This is exacerbated in plate formulations that have very high sensitivity and small exposure latitude. An additional drawback to this method is that the bump exposure requires specific conditions, including exposure time, irradiated light density, and the like, so that only the dissolved oxygen is quenched.

The pre-sensitization effect also wears off as the elapsed time between the bump exposure and main exposure increases. In conventional exposure of a printing plate, the elapsed time between the bump exposure and the main exposure is typically greater than about 10 or 20 seconds, allowing some oxygen to re-enter the plate prior to the main exposure. This causes the finished plate to have acceptable deep shadows. On the other hand, if the main exposure is applied very soon after the pre-sensitization step, as is envisioned in a computer-to-plate process, the tendency of shadow tones to fill is further worsened in comparison with conventional exposure techniques.

An in-line bumping and exposure system for printing plates and other substrates having a photosensitive layer is described in U.S. Pat. No. 6,903,809 to Donahue et al., the subject matter of which is herein incorporated by reference in its entirety. The system described by Donahue includes a linear illumination source for bumping the photosensitive material with a band of illumination to consume the dissolved oxygen within the photosensitive layer. However, this system, as with other prior art systems, provides a blanket pre-exposure of the entire photosensitive surface. For optimum image quality, the platesetter must typically wait between 2 and 100 seconds to permit some oxygen to return to the plate surface layers but not so long as to allow ambient oxygen to diffuse back into the middle layers of the photopolymer resin. This can be a disadvantage as it can create a time delay and thus lengthen the printing process.

Other efforts to improve the relief image printing plate have involved special plate formulations alone or in combination with the bump exposure.

For example, U.S. Pat. No. 5,330,882 to Kawaguchi et al., incorporated herein by reference in its entirety, describes a photosensitive resin composition that comprises a polymer binder, a radically polymerizable monomer, a sensitizing dye, and a polymerization initiator wherein the preliminary (bump) exposure is conducted with a light that only excites the sensitizing dye and the main exposure is conducted with a light that excites the photopolymerization initiator. In this instance, the preliminary exposure is conducted with a light only exciting the sensitizing dye, and the main exposure is conducted with a light exciting the photopolymerization initiator.

U.S. Pat. No. 4,540,649 to Sakurai, incorporated herein by reference in its entirety, describes a photopolymerizable composition that contains at least one water soluble polymer, a photopolymerization initiator and a condensation reaction product of N-methylol acrylamide, N-methylol methacrylamide, N-alkyloxymethyl acrylamide or N-alkyloxymethyl methacrylamide and a melamine derivative. According to the inventors, the composition eliminates the need for pre-exposure conditioning and produces a chemically and thermally stable plate.

U.S. Pat. No. 5,645,974 to Ohta et al., incorporated herein by reference in its entirety, discloses a photocurable mixture that includes paraffin or a similar waxy substance to inhibit effect of atmospheric oxygen. Due to its low solubility in the polymer, the paraffin floats at the beginning of the polymerization and forms a transparent surface layer that prevents the re-ingress of air once the exposure step is underway.

Although various methods of inhibiting/removing dissolved oxygen in the photosensitive resin composition have been suggested, there remains a need in the art for an improved method of removing dissolved oxygen, especially in computer-to-plate (CTP) processes.

SUMMARY OF THE INVENTION

The inventors of the present invention have discovered various improved processes for imagewise exposure of photosensitive printing elements to overcome the deleterious effects of oxygen in the photosensitive layer.

In accordance with a first embodiment of the present invention, the photosensitive layer is selectively exposed to actinic radiation which is of sufficient intensity to quench the oxygen in the photosensitive layer, particularly in areas where fine features are to be developed, but which is not at an intensity that will cure the photosensitive layer. Thus, certain areas of the photosensitive layer, such as fine feature areas, are pre-sensitized, while other areas, such as shadow areas are not pre-sensitized or are pre-sensitized to a lesser extent.

The inventors of the present invention have determined that in the fine feature areas, the pre-sensitization radiation quenches the dissolved oxygen, which would inhibit the exposure and development of these fine features, but pre-sensitization is minimized or avoided in shadow areas where the pre-sensitization radiation would fill in the shadows. This process thus achieves the goals of pre-sensitization without experiencing the detriments of the prior art, namely oxygen quenching in the shadow areas leading to filled-in shadow dots and reverse text.

It is an object of the present invention to provide an improved means for pre-exposing flexographic printing elements to remove oxygen from the photosensitive layer prior to imagewise exposure step.

It is another object of the present invention to provide an improved means for pre-exposing flexographic printing elements that is usable in a digital platemaking process.

To that end, various methods of achieving selective pre-sensitization of the photosensitive layer are described herein.

BRIEF DESCRIPTION OF THE DRAWINGS

The above set forth and other features of the invention are made more apparent in the ensuing Description of the Preferred Embodiments when read in conjunction with the attached Drawings, wherein.

DETAILED DESCRIPTION OF THE PREFERRED EMBODIMENTS

Figure 1:
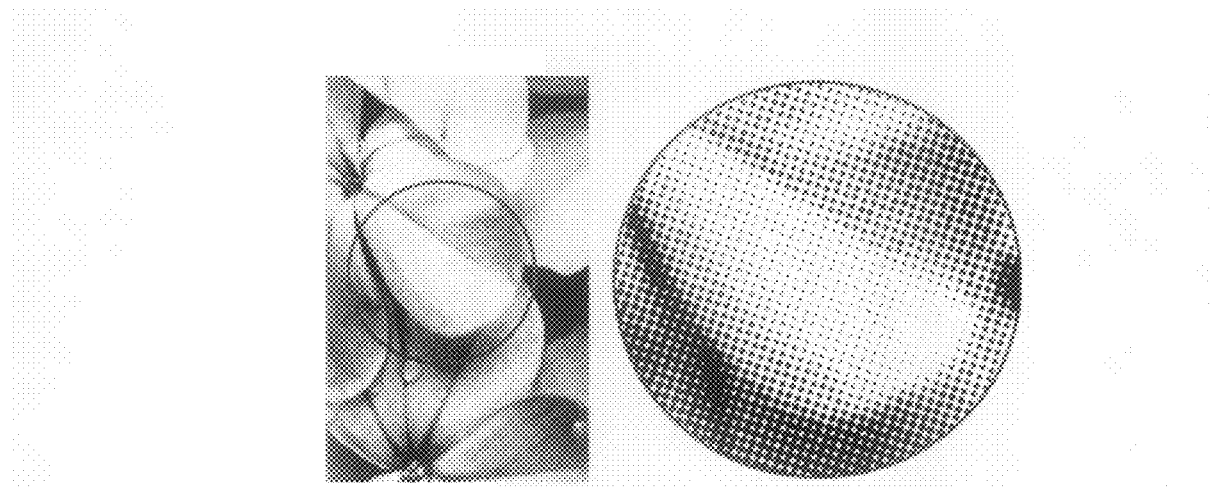
FIG. 1 depicts a grid pattern of a typical halftone screen.

The inventors have surprisingly discovered that an improved relief image printing element can be obtained when the bump exposure is selectively (preferentially) applied to the photosensitive substrate using a screen tint which is matched to and registered with the image. In one embodiment, the printing element is processed in a CTP device.

Shadow tones decrease with increasing bump exposure, while holding the main exposure constant. This demonstrates that shadow tones fill in when the bump dose is increased. Thus, in order to achieve a better printing surface, i.e., with less fill-in of shadow tones and thus greater definition on the printing surface, the inventors have developed a process for selectively pre-exposing the printing element instead of pre-exposing the entire printing surface as is traditionally done in the prior art.

For example, U.S. Pat. No. 5,455,416 to Zertani et al., herein incorporated by reference in its entirety, describes a pre-exposure device for "pre-sensitizing" printing elements that are to be imagewise exposed. The pre-exposure device of Zertani et al. is said to generate a very uniform exposure intensity over the working width of the printing form and the exposure intensity of the light emitting diode (LED) modules or LED arrangement can be infinitely varied. The pre-exposure device functions with light of a very low and very uniform intensity.

In the practice of instant invention, the pre-sensitization (or bump exposure) step is used selectively to bump mostly in fine feature areas, leaving the shadow tones and reverse text areas mostly or completely un-pre-sensitized, resulting in less fill in of the shadow tones. As understood by those skilled in the art, "shadow" refers to the darkest areas of the halftone image as compared to mid-tones (tones created by dots between about 30 percent and 70 percent of coverage) and highlights (lightest portions of an image as compared to mid-tones and shadows).

In a first embodiment, the bump exposure step is accomplished through a film or negative that provides for varying levels of opacity in accordance with the final image desired. Areas of the film where discrete raised features are to be established are substantially transparent and areas of the film that are to be developed away are substantially opaque to actinic radiation. The areas range between substantially transparent to substantially opaque. This severely reduces the bump exposure in the shadow and reverse text areas while allowing the fine feature areas to be adequately pre-sensitized, and thereby produces an effective result.

In an alternate embodiment, the bump exposure step is accomplished using a laser-based CTP device. Beam intensity and position are highly controlled in such a device, so applying a preferential pre-sensitization with the laser beam may be advantageous, particularly in a multi-beam device. In one embodiment, the CTP device digitally projects an image onto a printing element. The pattern itself can be in the form of dots or linework generated by the computer.

In further embodiments, the photopolymer can be selectively pre-exposed using a micromirror based device such as those available from Basys Print GmbH or an LED array. The Basys Print device can project a screen tint bump at low dose actinic radiation to selectively pre-sensitize the plate followed immediately by a full exposure of the desired image at the higher main dose of actinic radiation. The initial screen tint bump is applied in good register (i.e. alignment) with the location where the halftone dots are to be imaged in the subsequent main imaging step.

Regardless of the method used (film, laser, micromirror, LED array or other equivalent) the basis of the invention is the selective pre-sensitization of the photopolymer to remove unwanted oxygen particularly in areas where fine features need to be developed. Thus, the relative intensity and location of the actinic radiation reaching the photopolymer for pre-sensitization is controlled so that little or no pre-sensitization radiation impinges on the shadow areas while greater amounts of pre-sensitization radiation reaches areas where fine features must be developed. The pre-sensitization exposure is then quickly followed by the main imaging exposure which can be accomplished through a variety of methods as disclosed in the art. No lag time between the bump and main exposures is required, thus saving time in the plate exposing sequence.

This invention is particularly suited for digital platemaking. The sensitizing pre-exposure (i.e. bump) is done to the printing plate areas on and around the highlight dots while avoiding bumping in the areas on and around the shadow dots. In this instance, the bump dose is delivered in the form of a screen tint, which is at the same line screen, screen angle and registration as the halftone image file. Thus, the bump exposure is not the same in all areas of the plate, and some areas of the plate receive a pre-exposure and some areas of the plate receive no pre-exposure.

To that end, the present invention is directed to a method of producing a relief image printing plate comprising the steps of:

providing a digital photosensitive printing element, said photosensitive printing element comprising a photosensitive layer disposed on a base substrate, wherein a desired image is creatable in a surface of the photosensitive layer by selectively curing the surface of the photosensitive layer to create cured and uncured areas in the surface of the photosensitive layer and wherein said image to be created is contained in a digital image file;

providing a screen tint bump data file comprising a screen tint of the desired image at the same line screen, screen angle and registration as the image;

delivering a selective pre-exposure dose of actinic radiation by executing the screen tint bump data file and screen tinting the surface of said photosensitive layer to selectively pre-expose portions of the surface of the photosensitive layer to actinic radiation in accordance with the screen tint bump data file;

digitally providing an image onto the printing element and selectively imagewise exposing the surface of the photosensitive layer to actinic radiation in accordance with the digital image file to create cured and uncured areas on the surface of the photosensitive layer; and selectively removing uncured areas of the photosensitive resin layer to reveal the relief image.

"Halftone" refers to a process that photographs or scans a continuous tone image to convert the image into halftone dots and a photograph or continuous-tone illustration that has been halftoned and appears on film, paper, printing plate or final printed product. "Halftone screen" refers to a piece of film or glass containing a grid of line that breaks lights into dots. Conventional halftone screens are made up of dots of various sizes laid out in a grid pattern as shown in FIG. 1. The highlight areas in the picture are composed of small dots and the shadow areas are mostly black with small white areas.

Figure 2A:
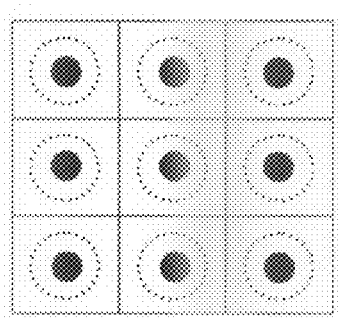
FIGS. 2A, 2B and 2C depict an enlarged view of highlight, midtone and shadow halftone cells and the portion of the halftone cell exposed by a screen tint bump in accordance with the present invention.
Figure 2B:
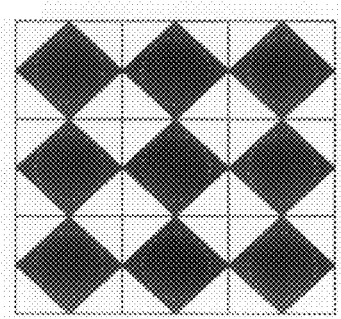
Figure 2C:
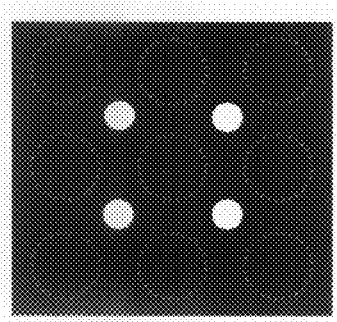

The pre-exposure dose is delivered as a screen dot at the same line screen as the halftone and in register with the halftone dots. The diagrams shown in FIGS. 2A-2C depict an enlarged view of highlight, midtone and shadow halftone cells. The portion of each halftone cell exposed by the inventive screen tint bump of the invention is represented by the area inside the dotted circles.

As is readily seen, the highlight dots to be imaged are fully encompassed by the screen tint bump dot, thereby properly sensitizing them prior to the subsequent imagewise exposure. Moreover, in the shadow areas, the screen tint bump dots do not overlap at all with shadow dots. This is possible because the center points of the shadow and highlight dots have different, non-overlapping center points.

The plate imaging speed is enhanced by the pre-exposure of the highlight dots and the tonal range is expanded by the avoidance of any pre-exposure in the shadow areas.

This feature of the present invention works for any line screen resolution, typically between 65 and 300 lines per inch (lpi) as long as the screen tint lpi is in register with the imaging screen. In addition, this feature of the invention works at any pixel resolution, typically between 500 and 3000 dots per inch (dpi). Any screen dot shape can be used, including but not limited to round, square, elliptical and combinations of one or more of the foregoing.

The screen tint bump dot can be round, square, polygonal, elliptical, or combinations of one or more of the foregoing.

The screen tint bump also works at any screen angle so long as the screen tint bump angle matches that of the image file screen.

The "dot percent" of the screen tint bump can vary from as little as 5% up to at least about 80%. The preferred range is between about 10% and 60%.

The optimum intensity of the screen tint bump is determined empirically, as it is with the bumping methods practiced in the prior art. Typically, for metal-backed and other opaque substrate plates, the optimum intensity is about 60-99% of the minimum bump energy needed to result in scum being left on the plate after processing. For plates more typically used for the printing of packaging where a polymerized floor is commonly intended, the optimum bump fluence is that which provides the needed enhancement of the highlight dot holding while maintaining adequate washout between the fine dots.

The present invention also works for any actinic wavelength, and light can be monochromatic, multi-line or broadband. The light quality (i.e., wavelengths, coherency, intensity, etc.) of the bump exposure can be the same or different from that used for the main exposure. In addition, the energy of the screen tint bump can be applied in a single dose or in a plurality of doses. The actinic radiation used for the screen tint bump can originate from the same source as that used for the imaging exposure or it can be a separate energy source, depending on the specific design of the platesetter device.

The delay between the bump and the main exposures can be anywhere from microseconds to about 60 seconds. In a preferred embodiment, the delay is less than about 10 seconds.

A benefit of this aspect of the present invention is that a screen tint bump digital file is created that matches the digital file to be imaged with respect to size dimension, line screen, registration and screen angle. A size and shape for the screen tint bump dot would have also previously been chosen. This screen tint bump file can be saved and reused universally for all similar image files. The screen tint bump file sits already ripped and ready to go, on the platesetter's computer server.

To image a plate, the plate setter first bumps the plate, or portions thereof, using the screen tint bump data file then follows this by the main exposure using the image file. The plate is then processed in the usual manner.

The use of the screen tint bump file of the invention improves the tonal range (i.e., fine dot holding and openness of the shadow/reverse areas) of digitally exposed relief image printing plates while simultaneously enhancing their imaging speeds.

Digitally imaged relief printing plates are typically either not pre-exposed at all or are pre-exposed using an essentially uniform blanket exposure. The pre-exposing light energy is sometimes applied over the entire plate in a single "flash" exposure, or alternatively, scanned across the surface. In both cases, all areas of the printing plate surface receive essentially the same dose of energy, even in the areas of the plate destined to be imaged as shadow areas. Sometimes a delay is used between the bump exposure and the main imagewise exposure to improve reverse depths. However, this tends to slow platemaking and is only partially effective at opening up the shadow areas.

The use of the screen tint bump provides the same preferential bump as the previously described embodiment but provides a benefit in being able to save and reuse the screen tint bump data file for other similar image files. In contrast, the use of an inverse image, as described above, requires separate and significant software code to implement and burdens the platesetter server greatly with computations to calculate and rip each unique bump image file because each image file requires a separate and unique bumping file.

The present invention provides various advantages including deeper deep shadows because of the elimination of the bump exposure in the shadow areas, higher productivity because there is no delay time needed between the bump and main exposure steps, and ease of implementation in the digital work flow because once set up, the same screen tint bump file can be used on all similar image files.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It should also be understood that the following claims are intended to cover all of the generic and specific features of the invention described herein and all statements of the scope of the invention that as a matter of language might fall there between.

What is claimed is:

1. A method of producing a relief image printing plate comprising the steps of:

providing a photosensitive printing element, said photosensitive printing element comprising a photosensitive layer disposed on a base substrate, wherein a desired image is creatable in the photosensitive layer by selectively curing the photosensitive layer to create cured and uncured areas in the photosensitive layer and wherein said image to be created is contained in a digital image file;

providing a screen tint bump data file comprising a screen tint that matches the image file in line screen, screen angle and registration;

delivering a selective pre-exposure dose of actinic radiation, comprising wavelengths from 320 nm to 450 nm, by executing the screen tint bump data file and screen tinting said photosensitive layer to selectively pre-expose portions of the photosensitive layer to actinic radiation, comprising wavelengths from 320 nm to 450 nm, in accordance with the screen tint bump data file such that portions of the photosensitive layer receive the full dose of pre-exposure actinic radiation and other portions of the photosensitive layer receive less than the full dose of pre-exposure actinic radiation or none at all;

digitally providing an image onto the printing element and selectively imagewise exposing the photosensitive layer to actinic radiation, comprising wavelengths from 320 nm to 450 nm, in accordance with the digital image file to create cured and uncured areas of the photosensitive layer;

selectively removing the uncured portions of the photosensitive resin layer to reveal the relief image; and wherein the photosensitive layer comprises (i) an elastomer compound, (ii) an ethylenically unsaturated compound having at least one terminal ethylenic group and (iii) a photoinitiator, and wherein there is a delay in time between delivery of the pre-exposure dose of actinic radiation and the imagewise exposure.

2. The method according to claim 1, wherein the image to be created comprises halftone dots comprising highlight dots, midtone dots and shadow dots and the screen tint comprises screen dots that are capable of being registered with the halftone dots of the image to be created.

3. The method according to claim 2, wherein the screen tinting step comprises positioning screen tint dots at locations on the surface of the photosensitive layer where highlight dots are located during the subsequent imaging step and not positioning screen tint dots around the shadow dots.

4. The method according to claim 2 wherein the shape of the screen dots is selected from the group consisting of round, square, polygonal, elliptical, and combinations of one or more of the foregoing.

5. The method according to claim 1, wherein the screen tint has a dot percent between about 10 percent and about 60 percent.

6. The method according to claim 1, wherein the source of actinic radiation used during the pre-exposure step is selected from the group consisting of monochromatic, multi-line and broadband sources of actinic radiation.

7. The method according to claim 6, wherein the source of actinic radiation is delivered as a single dose or as a plurality of doses.

8. The method according to claim 1, wherein the delay is between several microseconds and 60 seconds.

9. The method according to claim 1, wherein the screen tint bump file is saved and reused for similar digital image files.

10. The method according to claim 1, wherein the source of actinic radiation used during the pre-exposure step and the source of actinic radiation used during the imagewise exposure step are the same energy source.

11. The method according to claim 1, wherein the source of actinic radiation used during the pre-exposure step and the source of actinic radiation used during the imagewise exposure step are separate energy sources.

* * * * *